(12) United States Patent
Kuznia et al.

(10) Patent No.: US 8,348,522 B2
(45) Date of Patent: Jan. 8, 2013

(54) ATTACHABLE COMPONENTS FOR PROVIDING AN OPTICAL INTERCONNECT BETWEEN/THROUGH PRINTED WIRING BOARDS

(75) Inventors: Charles B. Kuznia, Encinitas, CA (US); Joseph F. Ahadian, San Marcos, CA (US); Richard T. Hagan, Mission Viejo, CA (US); Richard J. Pommer, Carlsbad, CA (US); Brian Catanzaro, San Diego, CA (US)

(73) Assignee: Ultra Communications, Inc., Vista, CA (US)

( * ) Notice: Subject to any disclaimer, the term of this patent is extended or adjusted under 35 U.S.C. 154(b) by 641 days.

(21) Appl. No.: 12/558,251

(22) Filed: Sep. 11, 2009

(65) Prior Publication Data
US 2010/0067853 A1    Mar. 18, 2010

Related U.S. Application Data

(60) Provisional application No. 61/096,507, filed on Sep. 12, 2008.

(51) Int. Cl.
*G02B 6/36* (2006.01)
(52) U.S. Cl. .......................... 385/88; 385/147
(58) Field of Classification Search .............. 385/12–16, 385/88–90, 147; 330/308, 310, 253
See application file for complete search history.

(56) References Cited

U.S. PATENT DOCUMENTS

| | | | | |
|---|---|---|---|---|
| 6,910,812 | B2 * | 6/2005 | Pommer et al. ................. | 385/92 |
| 7,072,535 | B2 * | 7/2006 | Uchida ........................... | 385/14 |
| 7,230,278 | B2 * | 6/2007 | Yamada et al. ................. | 257/80 |
| 2003/0025562 | A1 * | 2/2003 | Andreou et al. ............... | 330/308 |
| 2004/0145873 | A1 * | 7/2004 | Kim et al. ...................... | 361/748 |
| 2008/0260327 | A1 * | 10/2008 | Liao et al. ....................... | 385/14 |
| 2009/0016671 | A1 * | 1/2009 | Asai et al. ....................... | 385/14 |

* cited by examiner

*Primary Examiner* — Akm Ullah
(74) *Attorney, Agent, or Firm* — TechLaw LLP; Jonathan A. Kidney

(57) ABSTRACT

A component system and method is described that is made of components for transmitting, routing and receiving "in-air" optical signals for placement on printed wiring boards (PWBs). The transmitters are components including a light source attached to a transparent substrate and aligned to a coupling lens. The transparent substrate can contain circuitry for controlling the light source, or the circuitry could be attached to the transparent substrate. The receivers include a light detector attached to a transparent substrate with circuitry for converting optical signals to electrical circuitry (integrated onto the transparent substrate or separately attached). The routing components include a lens for coupling light into an optical waveguide, an optical waveguide and, optionally, a second lens for coupling light from the optical waveguide. The component system allows in-air optical communication between PWBs, without requiring traditional connections and harnesses between the PWBs, thus increasing their reliability and throughput.

21 Claims, 7 Drawing Sheets

ATTACHABLE COMPONENTS FOR PROVIDING AN OPTICAL INTERCONNECT BETWEEN/THROUGH PRINTED WIRING BOARDS

CROSS-REFERENCE TO RELATED APPLICATION(S)

This application claims the benefit of U.S. Provisional Patent Application No. 61/096,507, filed Sep. 12, 2008, the contents of which are hereby incorporated by reference in its entirety.

This invention is made with government support under contract number W911NF-06-C-0087, awarded by the Army. The government may have certain rights in this invention.

FIELD

This subject matter relates to the field of data communications, more particularly, to the field of optical communications between printed boards.

BACKGROUND

The communications industry, both telecom and datacom, are increasingly deploying architecture with stacked printed wiring boards (PWB). Functions such as servers and switches are migrating from a standalone box and into a board-level form-factor, which is called a blade, which plugs into a common chassis. Therefore, interconnect opportunities at the board level are becoming more important. As the transmission speed increases, copper-based interconnects are facing technical challenges in terms of speed, reach, EMI, and routing.

Data communications with missile and munitions bodies present a challenge to move high bandwidth data (digital and/or radio-frequency) between PWBs. There are strict constraints on the overall physical size of PWBs, making the routing and transport of high speed electrical data difficult.

Therefore, various methods and optical systems are disclosed that obviate the need for large and heavy data interconnects between PWBs, and also provide increased data capability.

SUMMARY

The following presents a simplified summary in order to provide a basic understanding of some aspects of the claimed subject matter. This summary is not an extensive overview, and is not intended to identify key/critical elements or to delineate the scope of the claimed subject matter. Its purpose is to present some concepts in a simplified form as a prelude to the more detailed description that is presented later.

The foregoing needs are met, to a great extent, by the present disclosure, wherein in one aspect an electro-optical system for communicating optical information between printed wiring boards (PWBs) is provided, comprising: an optically transmittive substrate; a lens disposed on a first side of the substrate; at least one of an optical emitter and optical receiver disposed on a second side of the substrate, substantially in axis with the lens; and electrically conductive pads disposed on the second side of the substrate, off-axis from the lens, allowing the substrate to be electrically connected to a PWB.

In yet another aspect of the present disclosure, an electro-optical system for communicating optical information between printed wiring boards (PWBs) is provided, comprising: an optically transmittive substrate; a plurality of lenses disposed on a first side and second side of the substrate; a plurality of at least one of a first optical emitter and first optical receiver disposed on the first side and the second side of the substrate, substantially in axis with respective plurality of lenses; and electrically conductive bonding elements disposed on the second side of the substrate, off-axis from the disposed lenses, allowing the substrate to be bonded to a PWB.

In yet another aspect of the present disclosure, an electro-optical system for communicating optical information between printed wiring boards (PWBs) is provided, comprising: means for supporting electrical components, having an optically transmittive property; light focusing means disposed on a first side and a second side of the supporting means; at least one of an optical energy transmitting means and optical energy receiving means disposed on the second side of the supporting means, substantially in axis with the focusing means; and electrically conductive means disposed on the second side of the supporting means, off-axis from the focusing means, allowing the supporting means to be electrically connected to a PWB.

In yet another aspect of the present disclosure, a method for communicating optical information between printed wiring boards (PWBs) is provided, comprising: supporting components on a substrate having an optically transmittive property; focusing light through a lens disposed on a first side of the substrate; at least one of emitting optical energy and receiving optical energy through the substrate and through the lens via an opto-electronic device, the opto-electronic device being substantially in axis with the lens; and providing electrical contact between the substrate and the opto-electronic device and between the substrate and a PWB.

Other aspects of the disclosure are found throughout the specification.

DETAILED DESCRIPTION

Introduction

Figure 1A:
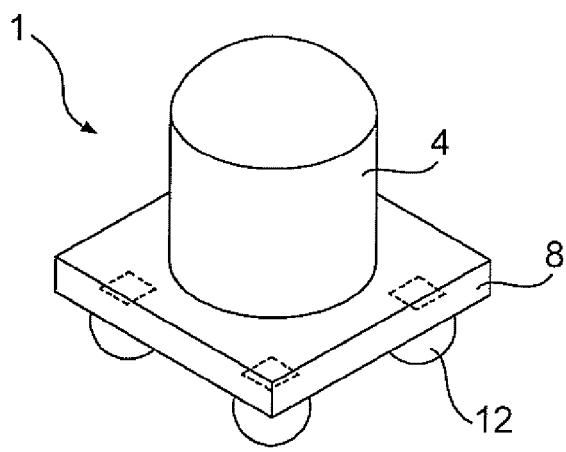
FIGS. 1A-C are perspective, side, and bottom view illustrations of an exemplary data channel surface mount optical receiver.

Backplanes are potential applications for optical interconnects. These are point-to-point or point-to-multipoint high-speed interconnects with typical lengths of under a few meters. The key advantages of optical backplane interconnects are low-crosstalk among the optical signals, and their large bandwidth. However, most of today's optical backplanes are more like patch panels rather than replacements for backplanes. Many different optical technologies have been demonstrated including polymer waveguides integrated into PWB layers and ribbon fiber arrays on top of the PWB. However, none of these optical technologies today have displaced copper interconnects outside of some niche applications. The transition to optical backplanes might be induced by the accumulating technical challenges facing electrical interconnects.

For optical interconnects to become widely accepted in backplane interconnects, a solution must have a competitive implementation cost. The key driver of cost is not the optical devices and components, but the manner of assembly. It has been well established that standard semiconductor techniques can be applied to creating the optical equipment (OE) components, such as, vertical-cavity surface-emitting laser (VCSEL) devices, multiple quantum well (MQW) modulators and detectors, and optical components, such as, diffractive gratings and lenses arrays.

In view of this, there are pathways for mass manufacturing of these devices in a manner that is high yielding and low cost. To be successful, one must be aware of the assembly tolerances required when assembling the component. For example, standard wirebond machines place wirebonds to 10 μm accuracy and pick and place machines (prior to component solder reflow) place components to a 25 μm accuracy. This gives a rough idea of the alignment tolerances that would be compatible with existing infrastructure.

As another consideration, the solutions should work within the existing PWB backplane format, due to the fact that industry (and the military) have significantly invested into the existing backplane connector infrastructure for manufacturing and testing. Also, today's optical components have rather large packages, not capable of high density implementation at the backplane.

In view of these considerations, presented herein are exemplary methods and systems of components that perform optical data communications between stacked PWBs. The components can be designed to be "pick-and-place" surface mount assembled on PWB. Combinations of an optical transmitter, optical receiver, and "optical through-board via" are illustrated and described. The optical through-board via creates an optical pathway directly through a PWB, allowing easy bypassing of intermediary board(s). The various illustrations shown herein, demonstrate that the exemplary components (or sometimes referred to as "module") are separate from the PWB and may be mechanically/electrically attached to the PWB as an "after" PWB build process. The design of the exemplary components allow communication between stacked PWBs, adding an optical interconnect capability between the PWBs. Therefore, the components are not considered part of the PWB building process, but an adjunct device that provides optical interconnect capabilities between PWBs, at a component level rather than at a board level. While it is understood that in some embodiments, the exemplary components "can" be attached to the PWB during the PWB build process, it is understood that they are discrete components, as show in the figures, and as evident in the description below, therefore, they are not a board level feature, but a separately implemented device. It is understood by one of ordinary skill in the art, and inherent in the description provided below, that by using individual components, a PWB having the desired optical interconnect features can be rapidly assembled. Further, the replacement of a defective optical interconnect component can be performed by simply removing the individualized component and re-attaching a non-defective component. Such a repair is not possible in PWBs with "built-in" optical interconnects, rather requiring the whole PWB to be replaced.

In various embodiments, light emitters, such as vertical-cavity-surface-emitting-lasers (VCSELs), and photodetectors can be, for example, flip-chip mounted to transparent substrates that contain integrated circuitry. Of course, other devices, whether light emitting or not may be found to be suitable, as well as other mounting approaches, and therefore may be used without departing from the spirit and scope of this disclosure. For example, integrated circuitry can be implemented directly on the substrate using a process such as silicon-on-sapphire, as one possible approach. For a silicon-on-sapphire approach, light emitters and photodetectors operating at wavelengths transparent to silicon can be directly mounted on silicon to form silicon supported circuitry. Alternatively, an integrated circuit device can be flip-chip mounted on the transparent sapphire substrate. The transparent substrate can have features to make electrical interconnections to a PWB. For example, these features might be solder balls, solder bumps, conductive epoxy, wire-bonds or leads, and so forth.

Though a sapphire substrate is described as one possible substrate type, other substrates that allow circuitry to be formed or attached may be utilized. For example, glass or plastic-based substrates (having some degree of transparency) may be deemed suitable for the various system(s) described herein. Also, multiple substrates or boards or configurations that enable one of ordinary skill to mount the exemplary devices described herein are understood to be within the spirit and scope of this disclosure.

A lens can be aligned to the light emitter or photodetector using various methods, such as active or passive alignment. Numerous active and passive alignment techniques are available. For example, active alignment can use an active light signal from the light emitter or into the photodetector as feedback during alignment. Passive alignment could be performed using, for example, a flip-chip bonding tool. Flip-chip bonding tools are particularly efficient as they can bring multiple objects into alignment and then bond them together. The bonding can be electrical (for example, solder or gold bumps, etc.) or non-electrical (for example, epoxy, etc.). The result of this structure is a compact component that can be 'picked-and-placed' on a PWB to form an optical transmitter or receiver. Of course, other alignment processes, such as registrations, and so forth may be used without departing from the spirit and scope of this disclosure.

An optical through-board via can be formed using a lens attached, or formed onto, a length of an optical waveguide structure. This can be accomplished by forming a receiving lens that couples light into the waveguide and a transmitting lens that couples light out of the waveguide. In some embodiments, the optical waveguide can act as a via or as a directional via. In other embodiments, the optical waveguide structure can couple light directly into/from the lens or indirectly into/from the lens, for example, separately from the lens' axis.

The three components (optical receiver, optical transmitter and optical through-board via) together can form a very efficient and lightweight system for communicating optical data between two or more PWBs. The devices can be designed to accept alignment tolerances of 'pick-and-place' machines, meaning that light will be efficiently coupled between components even with some misalignment of the components between PWBs.

Description

Figure 1B:
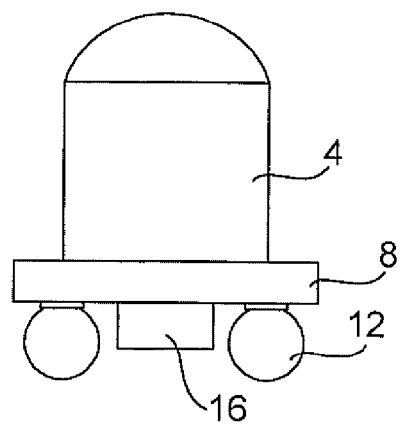
Figure 1C:
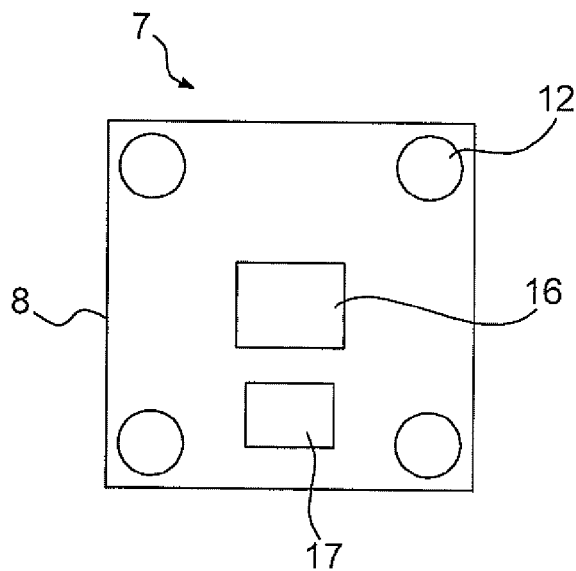

FIGS. 1A-C are perspective, side and bottom views, respectively, of an exemplary single data channel surface mount optical receiver 1. The receiver 1 comprises an optical lens 4 disposed above a transparent or light-passing substrate 8, having electrical conduits 12 to provide electrical connection between substrate 8 and the PWB. Conduits 12 may be solder balls or any other electrical connection mechanism.

As mentioned above, silicon-on-sapphire substrates are well suited as they are known for their light-transmittive characteristics and also provide radiation hardness. The substrate 8 may be configured with integrated circuitry 17 that supports optical to electrical signal conversion, and/or other electrical operations. Circuitry 17 can be formed directly on the substrate 8, such as in a silicon-on-sapphire integrated circuitry process, or flip-chip bonded as a separate integrated circuit, or any other process that attaches directly or indirectly the integrated circuitry 17 to the substrate 8. Photodetector 16 is attached to the substrate 8 and is in electrical communication with circuitry 17 on the substrate 8. The photodetector 16 may be flip-chipped onto the substrate 8, according to design and implementation preferences. In operation, lens 4 receives and focuses optical power through the substrate 8 and onto the photodetector 16, whose signal is converted/processed by circuitry 17. In some embodiments, the photodetector 16 may comprise the circuitry 17. That is, a photodetector 16 may be devised with circuitry 17 built-into the photodetector 16.

In another embodiment to a silicon on sapphire substrate with circuitry 17 formed directly on the substrate 8, the optically transmittive substrate 8 could be an insulating and optically transmittive material such as silicon dioxide, sapphire, or other suitable material, with the circuitry 17 directly mechanically bonded to the substrate 8 using techniques well known to one skilled in the art such as direct oxide-oxide bonding or an organic bonding material. Substrates with circuitry created with so-called bonded wafer techniques can provide the advantages of a substrate 8 with optically transmittive properties and circuitry 17 placed directly on the substrate 8 similar to silicon on sapphire. Additional circuitry can then be attached to the substrate using the techniques such as flip-chip as described above.

Figure 2A:
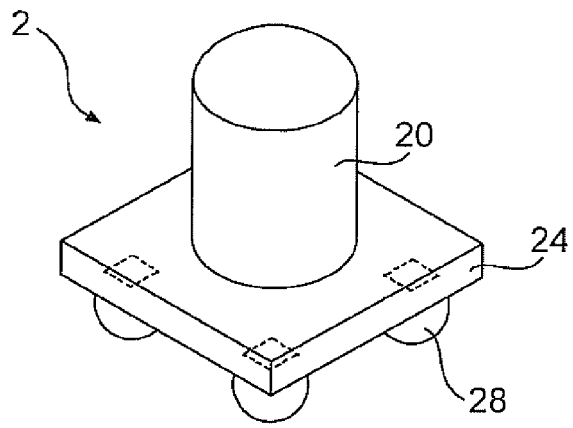
FIGS. 2A-C are perspective, side, and bottom view illustrations of an exemplary single data channel surface mount optical transmitter.
Figure 2B:
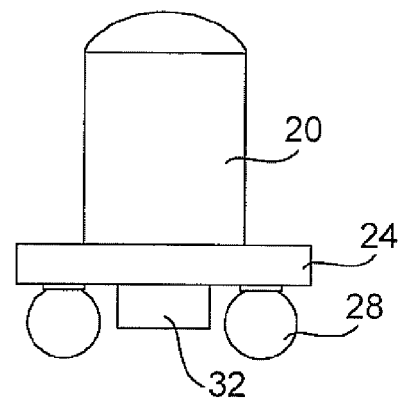
Figure 2C:
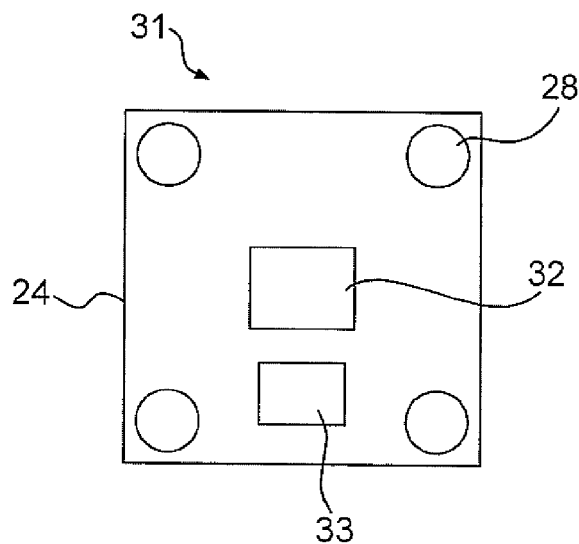

FIGS. 2A-C are perspective, side and bottom views, respectively, of an exemplary single data channel surface mount optical transmitter 2. The optical transmitter 2 configuration is in many respects, similar to the configuration described for the receiver 1 of FIGS. 1A-C. A lens 20 is disposed over transparent or light-transmittive substrate 24. Electrical conduits 28 provide electrical connection between the substrate 24 and the PWB. The substrate 24 contains integrated circuitry 33 that supports electrical to optical signal conversion. This circuitry 33 can be formed directly on the substrate, such as in a silicon-on-sapphire integrated circuitry process, or flip-chip bonded as a separate integrated circuit, or any other applicable method. An optical light emitter 32 is attached, using flip-chip technology or other technology, and is in electrical communication with circuitry 33 on the substrate 24. Lens 20 forms the optical power from the light emitter 32 into a beam that is transmitted from the package and can be coupled efficiently into another component.

It should be appreciated in the above-described embodiments that the shape and location of the various elements of the receiver 1 and transmitter 2 may be modified, changed, modularized, etc., as according to design preference. For example, the electrical conduits 12, 28 may be located at other areas of the substrate 8, 24, as well as the lens 4, 20 being of a shape or configuration that is different than that shown. Accordingly, modifications to the various elements are understood to be within the purview of one of ordinary skill and may be made without departing from the spirit and scope of these embodiments.

Figure 3A:
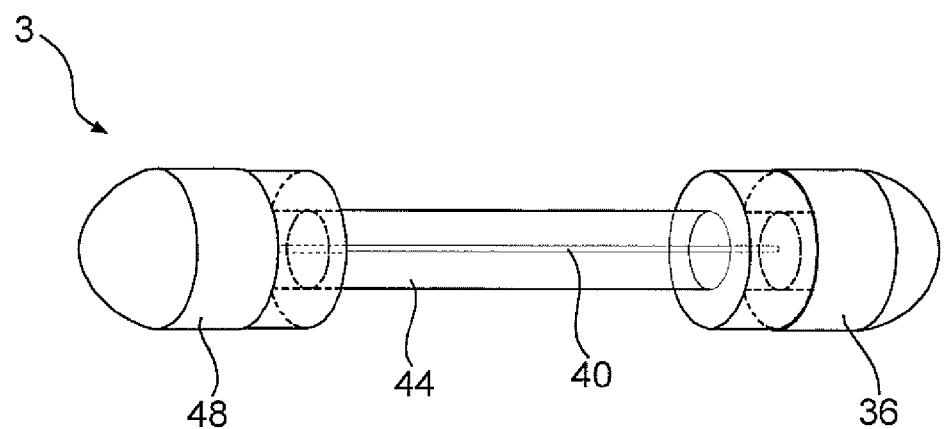
FIGS. 3A-B are perspective and cross-sectional side view illustrations of an exemplary optical through-board via.
Figure 3B:
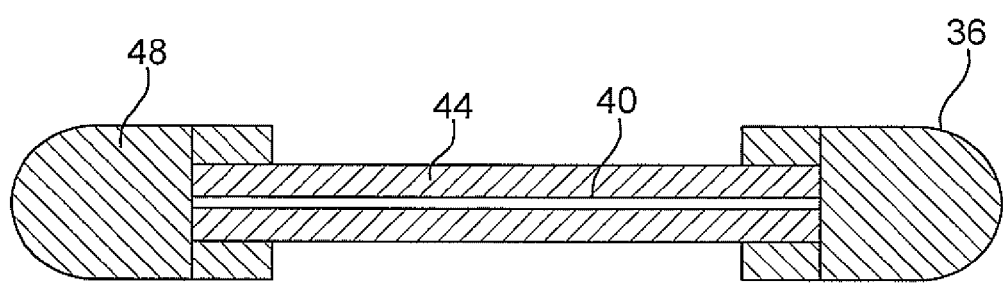

FIGS. 3A-B are perspective and cross-sectional views of an exemplary single data channel optical through-board via 3. Lens elements 36, 48 operate to focus light into optical waveguide 40 that is held within mechanical support 44. Lenses 36, 48 may be symmetrical in shape or different in shape, depending on design preference. In operation, light transmitted by an optical transmitter (not shown) will be received by a lens 36, 48 and, being focused by lens 36, 48, will travel through waveguide 40 to the other lens 48, 36 for transmission off-via to another component (not shown). In some instances, the mechanical support 44 may operate as the waveguide 40. Also, in some instances, the via 3 may be configured in a non-fixed-linear manner, so as to allow light to be transmitted in an off-axis orientation.

Figure 4A:
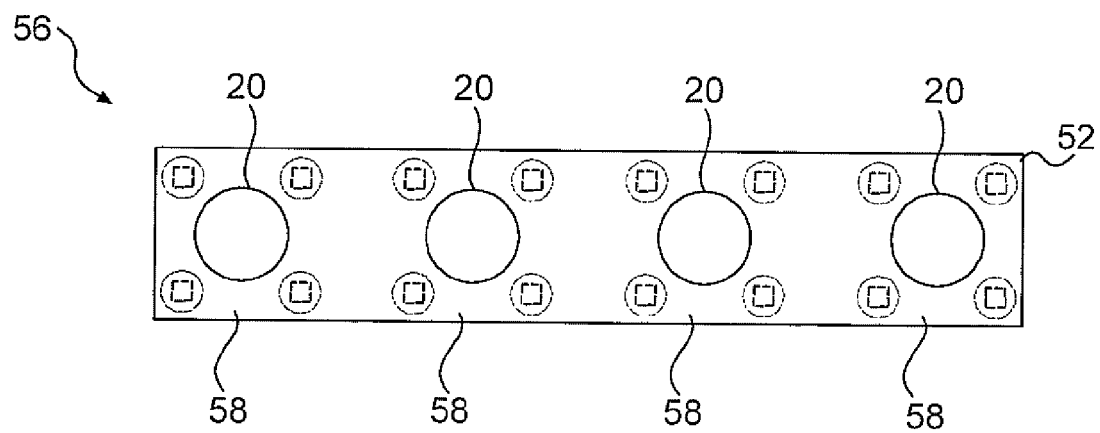
FIGS. 4A-B are top view illustrations of an exemplary four data channel surface mount optical transmitter and receiver.
Figure 4B:
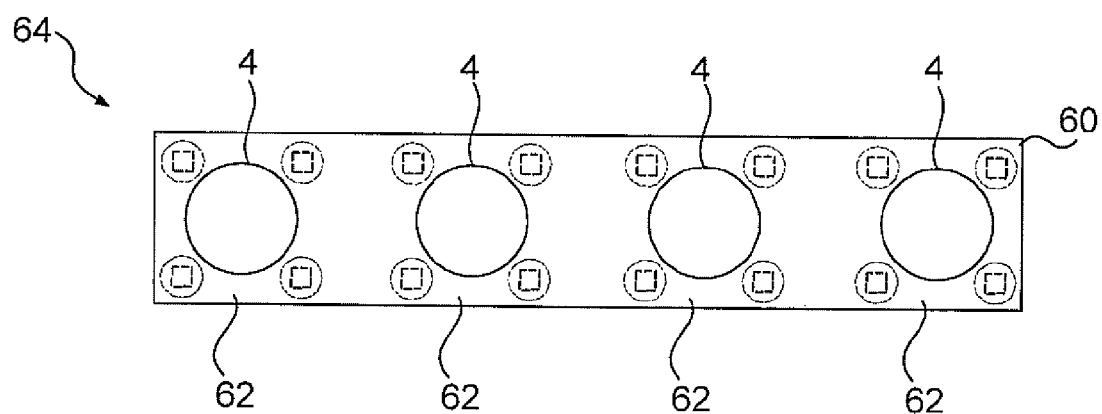

FIGS. 4A-B are top views of exemplary multiple data channel, single dimensional arrays for a surface mount optical transmitter array 56 and receiver array 64, respectively. Referring to FIG. 4A, substrate 52 can house multiple data channels 58 and multiple lenses 20. Referring to FIG. 4B substrate 60 can house multiple data channels 62 and multiple lenses 4. It should be appreciated that the linear arrangement of the array transmitter 56 and array receiver 64 is an arbitrary arrangement. That is, in some embodiments, it may be desirable to configure the arrangement to be non-linear, as well as non-equally spaced. Therefore, one of ordinary skill would understand that FIGS. 4A-B demonstrate one of several possible ways to arrange the individual transmitters and receivers. For example, FIGS. 4A-B show individual lens 20, 4—it is possible to replace a plurality of individual lens 20, 4 with a single multiple window lens.

Figure 5B:
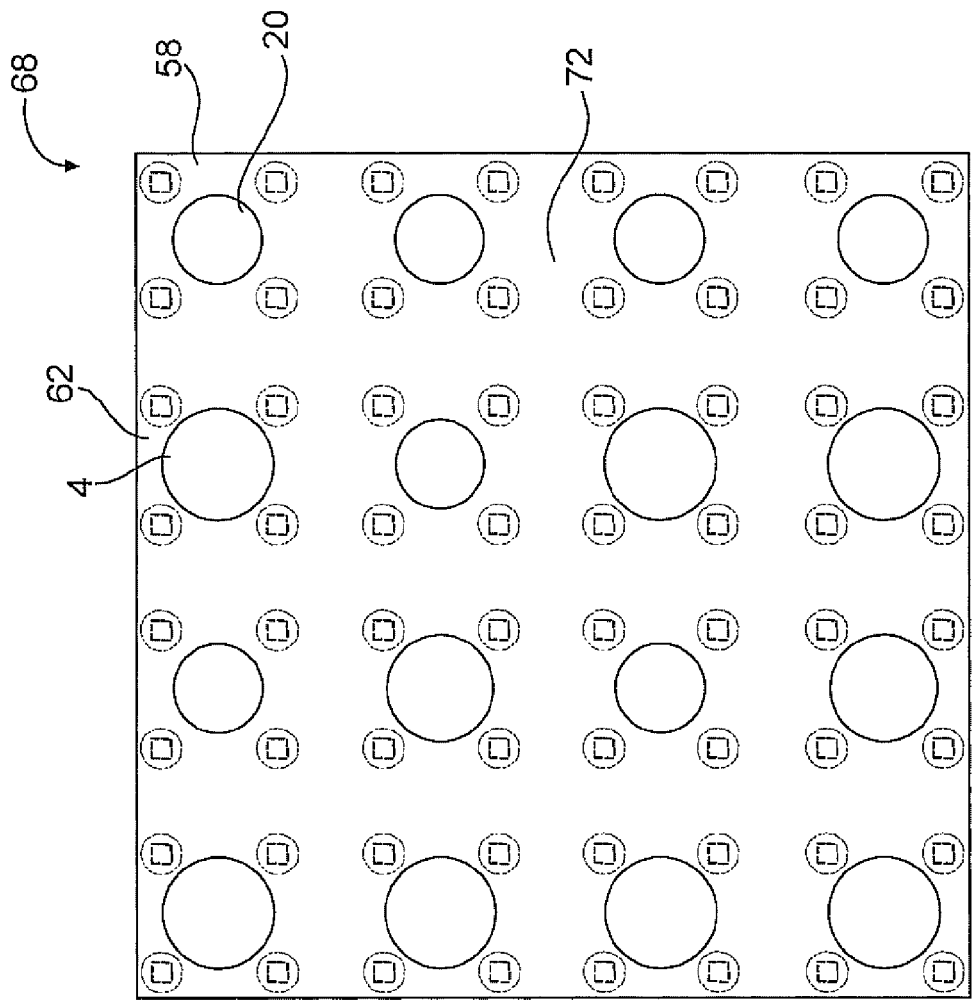
FIGS. 5A-B are side and top view illustrations of an exemplary multi-channel surface mount component containing multiple optical transmitters and receivers.
Figure 5A:
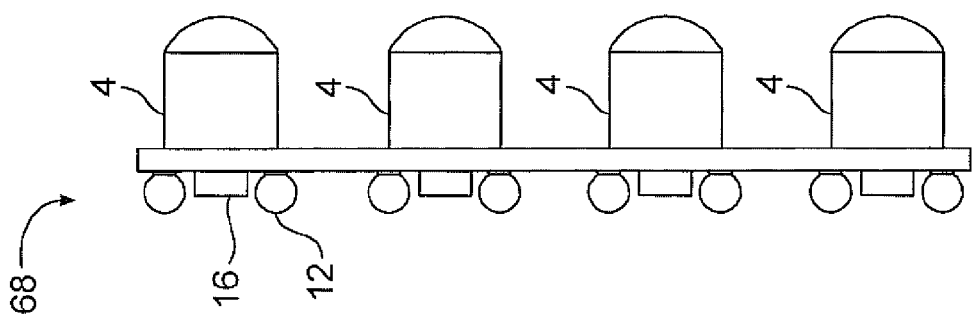

FIGS. 5A-B are side and top views of an exemplary multiple data channel, two dimensional array, in a surface mount optical transceiver, containing both transmitters and receivers. FIGS. 5A-B are demonstrative of how a single substrate 72 can house multiple transmitter data channels 58, receiver data channels 62, multiple transmitting lenses 4 and multiple receiving lenses 20. Electrical conduits 12 provide electrical connection between the transparent substrate 72 and the PWB for each data channel. The various "sizes" and locations of the respective lenses/elements shown in FIGS. 5A-B can be adjusted, according to design preference, without departing from the spirit and scope herein. For the purposes of illustration, the receiver lenses 20 are shown as being smaller than the transmitter lenses 4.

Figure 6:
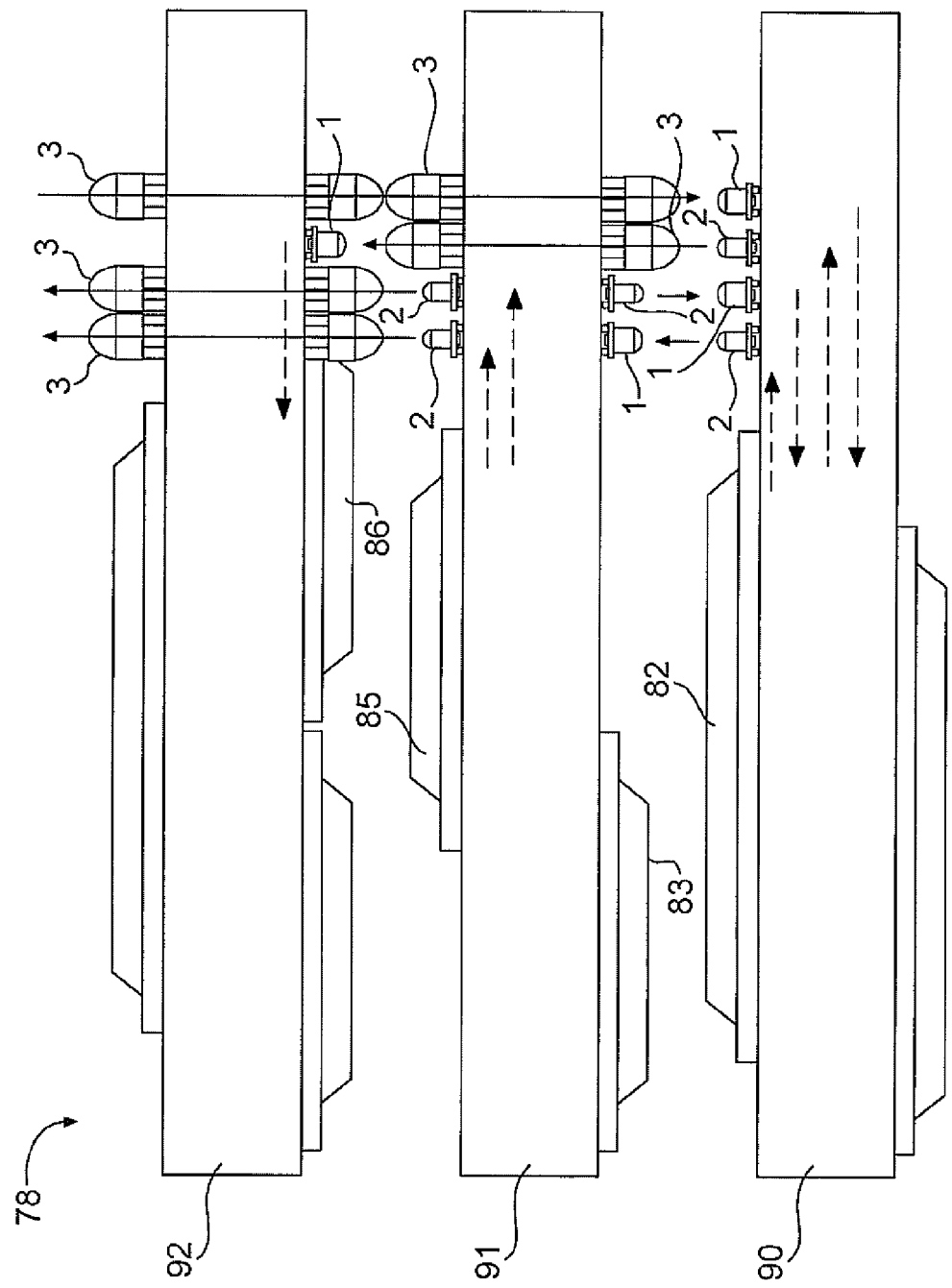
FIG. 6 is a side-view illustration of an exemplary system of optical interconnects.

FIG. 6 is side view illustration of an exemplary optical data communications embodiment 78 on PWBs in a layered configuration. A series of PWBs 90, 91, and 92 are stacked or layered so as to align respective optical transmitters 2, receivers 1, and vias 3. The various PWBs contain circuitry which supports communication with the optical transmitters 2 and receivers 1. For example, PWB 90 contains integrated circuits 82 that source data in an electrical format to surface mount optical transmitters 2 located on PWB 90. The integrated circuits 82 can also receive data in an electrical format from surface mount optical receivers 1, also located on PWB 90. PWB 91 contains integrated circuits 83, 85 and also surface mount optical receiver 1, transmitters 2, and optical through-board vias 3. PWB 92 contains optical vias 3, a surface mount optical receiver 1, and circuit 86.

In operation, optical signals from the surface mount transmitter 2 on PWB 90 can be transmitted to surface mount receiver 1 on PWB 92 via optical through-board vias 3 on PWB 91. Light passing through the optical through-board vias 3 on PWB 91 can be transmitted to surface mount optical receivers 1 on PWB 92. Conversely, light passing through optical through-board vias 3 on PWB 92 and optical through-board vias 3 on PWB 91 can be detected by surface mount optical receivers 1 on PWB 90. PWB 91 can also send and receive signals using its transmitters 2 and receiver 1. Combinations of receivers 1, transmitters 2, and vias 3 enable the PWBs to efficiently transmit/receive information from neighboring PWBs without resorting to heavy electrical cabling or even temperamental fiber optic lines. Additional PWBs (not shown) can be optionally placed above PWB 92 to form an arbitrarily high stack of PWBs in optical communication with one another.

Figure 7:
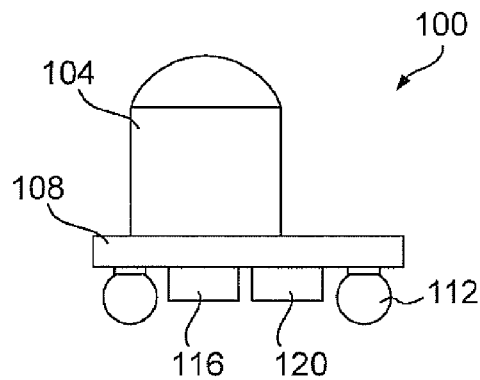
FIG. 7 is a side view of an optical transmitter or receiver containing an integrated circuit separately attached.

FIG. 7 is a side view illustration of an exemplary optical component 100 (transmitter or receiver) having an integrated circuit 120 attached to the substrate 108. Electrical conduits 112 provide electrical connection between the substrate 108 and the PWB. The substrate 108 has integrated circuitry 120 attached which is in electrical contact with signal paths (not shown) formed on the substrate 108. An optical photodetector or optical emitter 116 is attached to the substrate 108 and is also in electrical communication with signal paths on the substrate 108. Lens 104 receives and focuses optical power into/out of the photodetector/emitter 116.

Figure 8:
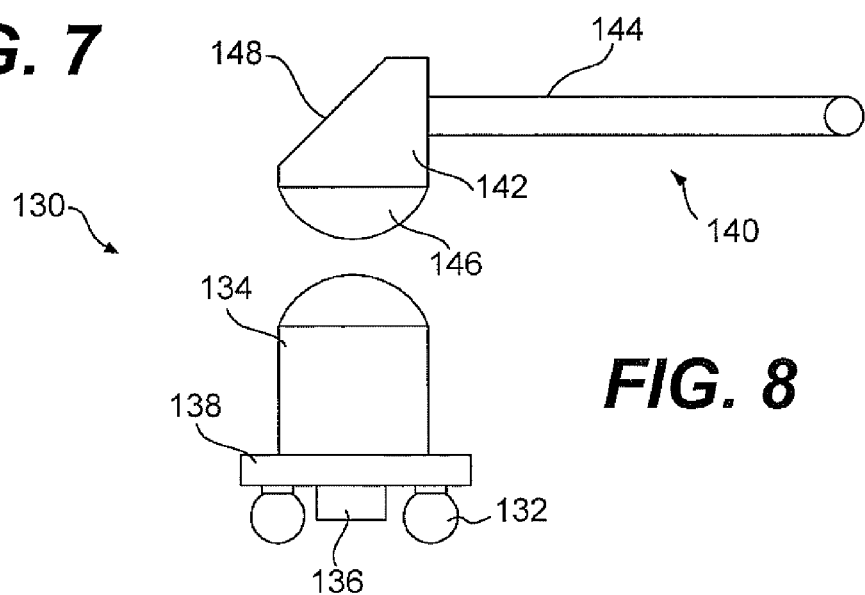
FIG. 8 is an embodiment of an optical transmitter or receiver in optical communication with an optical waveguide.

FIG. 8 is a side view illustration of an exemplary optoelectronic device 130 with another exemplary via 140. Optoelectronic device 130 contains lens 134, substrate 138, and optoelectronic chip 136 according to the embodiments described above. Via 140 contains lens 146 mated to assembly 142. Assembly 142 couples light entering the lens 146 to either of the optical wave guide 144 and/or through optional reflective/transmittive turning surface 148. Depending on the characteristics of the reflective/transmittive turning surface, light impinging the surface 148 may be partially reflected and/or partially transmitted. Alternatively, complete reflection or complete transmission may occur, according to design of the reflective/transmittive surface 148. Conversely, light entering through the optical wave guide 144 may impinge on the interior of the surface 148 and travel through the assembly 142 into lens 146, and/or be entirely or partially redirected by the surface 148 into another direction. In some instances, the light may be directed to optoelectronic device 130. In other instances, the light may emanate from the optoelectronic device 130.

Figure 9:
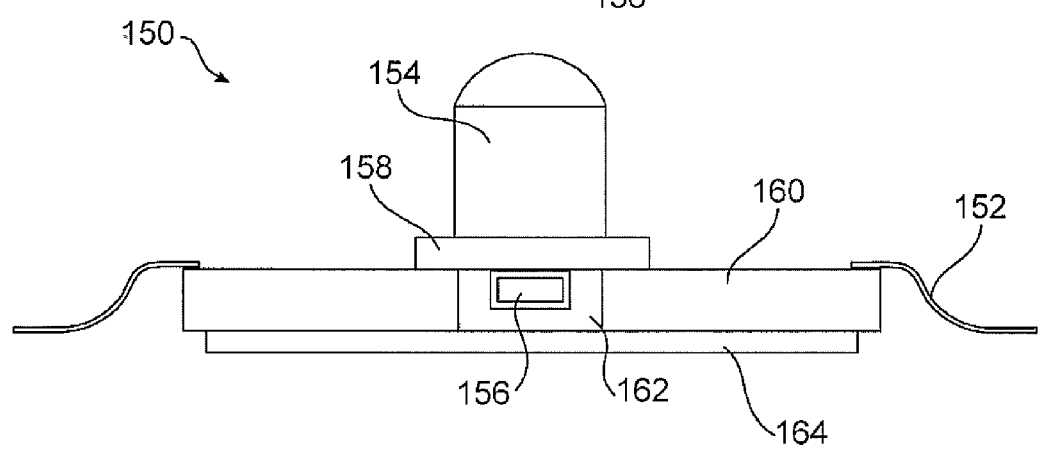
FIG. 9 is an embodiment of an optical transmitter or receiver having a secondary substrate for distributing electrical paths.

FIG. 9 is a side view illustration of an exemplary optical transmitter (or receiver) 150 that utilizes a secondary substrate 160 for distributing electrical signal paths. Electrical conduits 152 provide electrical connection between the secondary substrate 160 and the PWB (not shown). The substrate 158 contains integrated circuitry (not shown) that supports optical to electrical signal conversion. This circuitry can be formed directly on the substrate 158, such as in a silicon-on-sapphire integrated circuitry process, or flip-chip bonded as a separate integrated circuit. The substrate 158 contains electrical signal paths (not shown) that have a connection to electrical signal paths (not shown) on the secondary substrate 160. An optoelectronic device 156 is attached and is in electrical communication with circuitry on the substrate 158. Lens 154 couples light into or out of the optoelectronic device 156. Material 162 may be in contact with both the optoelectronic device 156 and used to cover the cavity containing the optoelectronic device 156. In many instances, the material may be a sealing or conductive material, and so forth.

In various embodiments, the substrate 158 is a silicon on sapphire die with circuitry and solder bumps on the bottom side of the die in FIG. 9. Solder bumps are used for electrical connection from substrate 158 to optoelectronic device 156. Solder bumps are also used for electrical connection from substrate 158 to secondary substrate 160. In another embodiment, the substrate 158 is a die made using bonded wafer techniques, with circuitry and solder bumps used in a manner similar to that described above for the silicon on sapphire die.

It will be understood that many additional changes in the details, materials, steps and arrangement of parts, which have been herein described and illustrated to explain the nature of the invention, may be made by those skilled in the art within the principle and scope of the invention as expressed in the appended claims.

What is claimed is:

1. An electro-optical module for communicating optical information between stacked printed wiring boards (PWBs), the module comprising:
   a non-PWB optically transmittive substrate, the substrate not being part of a PWB building process;
   a lens disposed on a first side of the substrate, over a non-viaed portion of substrate;
   at least one of an optical emitter and optical receiver disposed on a second side of the substrate, over a non-viaed portion of the substrate, and substantially in axis with the lens; and
   electrically conductive pads disposed on the second side of the substrate, off-axis from the lens, allowing the substrate to be mechanically and electrically connected to a PWB of a stacked set of PWBs, thereby enabling optical communication between the stacked PWBs.

2. The electro-optical module of claim 1, further comprising an integrated circuit disposed on the second side of the substrate, operatively coupled to the at least one of the optical emitter and optical receiver.

3. The electro-optical module of claim 1, wherein the substrate is a semi-conductor.

4. The electro-optical module of claim 2, wherein the integrated circuit is fabricated into the substrate.

5. The electro-optical module of claim 2, wherein the substrate is silicon dioxide and the integrated circuit is bonded to the substrate.

6. The electro-optical system module of claim 1, wherein the at least one of the optical emitter and optical receiver is flip-chipped to the substrate.

7. The electro-optical module of claim 2, wherein the integrated circuit is flip-chipped to the substrate.

8. The electro-optical module of claim 1, wherein the electrically conductive bonding elements are solder balls.

9. The electro-optical module of claim 1, wherein the substrate is electrically connected to the PWB using flip-chipping.

10. The electro-optical module of claim 1, further comprising a non-linear optical via, the via comprising:
    at least one of a reflective and transmittive turning surface; and
    a fiber optic cable disposed at an off-axis to the non-linear optical via.

11. The electro-optical module of claim 1, further comprising a second substrate containing a cavity to house the at least one optical emitter and optical receiver.

12. The electro-optical module of claim 11, further comprising electrical leads attached to the second substrate.

13. The electro-optical module of claim 1, further comprising a plurality of PWBs.

14. The electro-optical module of claim 1, wherein the at least one optical emitter is a vertical-cavity-surface-emitting-laser (VCSEL) and the at least one optical receiver is a photodetector.

15. An electro-optical module for communicating optical information between stacked printed wiring boards (PWBs), comprising:
   a non-PWB optically transmittive substrate, the substrate not being part of a PWB building process;
   a plurality of lenses disposed on a first side and a second side of the substrate, over non-viaed portions of the substrate;
   a plurality of at least one of a first optical emitter and first optical receiver disposed on the first side and the second side of the substrate, over non-viaed portions of the substrate, and substantially in axis with respective plurality of lenses; and
   electrically conductive bonding elements disposed on the second side of the substrate, off-axis from the disposed lens, allowing the substrate to be, electrically and mechanically bonded to a PWB of stacked set of PWBs, thereby enabling, optical communication between the stacked PWBs.

16. The electro-optical module of claim 15, further comprising a PWB that the module is bonded to.

17. The electro-optical module of claim 15, further comprising a plurality of PWBs.

18. An electro-optical module for communicating optical information between stacked printed wiring boards (PWBs), comprising:
   means for supporting electrical components, having an optically transmittive property, the means for supporting not being part of a PWB building process;
   light focusing means disposed on a first side and a second side of the supporting means, over non-viaed, portions of the supporting means;
   at least one of an optical energy transmitting means and optical energy receiving means disposed on the second side of the supporting means, over non-viaed portions of the supporting means, and substantially in axis with the focusing means; and
   electrically conductive means disposed on the second side of the supporting means, off-axis from the focusing means, allowing the supporting means to be electrically connected to a PWB of a stacked set of PWBs thereby enabling optical communication between the stacked PWBs.

19. The electro-optical module of claim 18, further comprising a plurality of PWBs.

20. The electro-optical module of claim 18, further comprising an optical channeling means for channeling light through the supporting means.

21. The electro-optical module of claim 18, further comprising an off-axis optical channeling means, for channeling light substantially parallel to the supporting means.

* * * * *